United States Patent [19]

Okuhara et al.

[11] 4,232,234
[45] Nov. 4, 1980

[54] SEMICONDUCTOR SWITCH CIRCUIT

[75] Inventors: Shinzi Okuhara, Fujisawa; Ichiro Ohhinata, Yokohama; Michio Tokunaga, Zushi, all of Japan

[73] Assignee: Hitachi, Ltd., Japan

[21] Appl. No.: 811,143

[22] Filed: Jun. 28, 1977

[30] Foreign Application Priority Data

Jul. 2, 1976 [JP] Japan .................................. 51/77796

[51] Int. Cl.² ........................................... H03K 17/72
[52] U.S. Cl. ................. 307/252 G; 307/305; 307/252 T
[58] Field of Search .......... 307/252 D, 252 G, 252 N, 307/252 T, 305; 179/15 AT

[56] References Cited

U.S. PATENT DOCUMENTS 4,058,741 11/1977 Tokunaga et al. ............... 307/252 G

*Primary Examiner*—John Zazworsky
*Attorney, Agent, or Firm*—Craig & Antonelli

[57] ABSTRACT

In a semiconductor switch circuit employing at least one 4-terminal PNPN switch having a cathode gate and an anode gate for switching an AC signal, a current supplying circuit is connected to the cathode gate of the PNPN switch, and a current sinking circuit of constant-current type is connected to the current supplying circuit and the anode gate of the PNPN switch through a current change-over circuit. Depending on the potential of the PNPN switch, the current change-over circuit supplies selectively the current flowing into the current supplying circuit and the current flowing out from the anode gate of the PNPN switch to the current sinking circuit.

The current supplying circuit operates as a constant-current circuit owing to the current sinking function of the current sinking circuit. The semiconductor switch circuit is simple in circuit construction and can be economically integrated into an integrated circuit form.

4 Claims, 5 Drawing Figures

SEMICONDUCTOR SWITCH CIRCUIT

BACKGROUND OF THE INVENTION

1. Field of the Invention

This invention relates to a semiconductor switch circuit used in a telephone exchange system or the like and employing 4-terminal PNPN switches capable of passing a continuous AC signal.

2. Description of the Prior Art

In a conventional semiconductor switch circuit employing 4-terminal PNPN switches for switching an AC signal, a couple of such PNPN switches are connected in inverse-parallel relation to constitute a bilateral switch, and current is supplied from an associated drive circuit into the cathode gates of these two PNPN switches to permit passage of the AC signal. However, the conventional semiconductor switch circuit with such a construction has been disadvantageous in that the drive voltage of the drive circuit is required to exceed the maximum value of the signal voltage of the transmitted AC signal depending on the load condition.

In an effort to obviate such a disadvantage, an improved semiconductor switch circuit employing a 4-terminal PNPN switch for switching an AC signal has previously been proposed by the inventors in Japanese Laid-Open Publication No. 10012/77 published Jan. 26, 1977. This improved semiconductor switch circuit has a construction as shown in FIG. 1.

The proposed semiconductor switch circuit shown in FIG. 1 comprises a current-supplying constant-current circuit 2 including transistors $Q_1$ and $Q_2$, a resistor $R_1$ and level shift diodes $D_4$; a current-sinking constant-current circuit 3 including a transistor $Q_3$, a resistor $R_2$ and level shift diodes $D_5$; a 4-terminal PNPN switch 1; a current change-over circuit 4 including reverse current blocking diodes $D_1$, $D_1'$ and $D_2$; and reverse-current blocking diodes $D_3$ and $D_3'$. In this prior art semiconductor switch circuit, the current change-over circuit 4 distributes the output current of the current-supplying constant-current circuit 2 to the cathode gate $G_K$ of PNPN switch 1 and to the current-sinking constant-current circuit 3 depending on the potential at the cathode of PNPN switch 1. When the potential at the cathod K of PNPN switch 1 is negative, current flows into the cathode gate $G_K$ to turn on the PNPN switch 1, while when the potentials at the cathode K and anode A are both positive, current flows out from the anode gate $G_A$ to turn on the PNPN switch 1. Although not shown in FIG. 1, the diodes $D_1'$ and $D_3'$ are connected to the cathode gate and anode gate respectively of another PNPN switch connected in inverse-parallel relation to the illustrated PNPN switch 1. A control circuit including a power supply $E_1$, a switch $SW_1$ and a resistor $R_3$ is illustrated in FIG. 1 to facilitate understanding of the circuit operation. It is apparent however that this control circuit is actually an electronic circuit.

While the proposed semiconductor switch circuit shown in FIG. 1 has been satisfactory in obviating the aforementioned prior art defect, it has still been defective in that many elements thereof have to be separately electrically isolated from one another during integration into an integrated circuit form, and thus the desired high integration density cannot be achieved. For example, in the case of the diodes $D_1$, $D_1'$ and $D_2$ which are common-connected at one end thereof, their anodes can be formed in a common P-type semiconductor region, but their cathodes must be formed in independent N-type semiconductor regions. Further, in this case, a high breakdown voltage is required for these diodes $D_1$, $D_1'$ and $D_2$ since the voltage of the load circuit is sometimes applied to these diodes $D_1$, $D_1'$ and $D_2$.

SUMMARY OF THE INVENTION

It is an object of the present invention to provide an improved semiconductor switch circuit employing a PNPN switch for switching an AC signal, in which the PNPN switch can be reliably turned on by a single power supply of low voltage even when inserted in a load circuit operating with a positive or negative voltage.

Another object of the present invention is to provide an economical semiconductor switch circuit employing a PNPN switch for switching an AC signal, which is simple in circuit construction and can be integrated into an integrated circuit form with a high integration density.

In accordance with the present invention, there is provided a semiconductor switch circuit comprising at least one 4-terminal PNPN switch having a cathode gate and an anode gate, a current supplying circuit including means for supplying current to the cathode gate of said PNPN switch, a current sinking circuit of constant-current type including means for sinking current, and a current change-over circuit including current path change-over means for selectively supplying the current flowing out from the anode gate of said PNPN switch and the current flowing into said current supplying circuit to said current sinking circuit depending on the potential of said PNPN switch.

DESCRIPTION OF THE PREFERRED EMBODIMENTS

Figure 1:
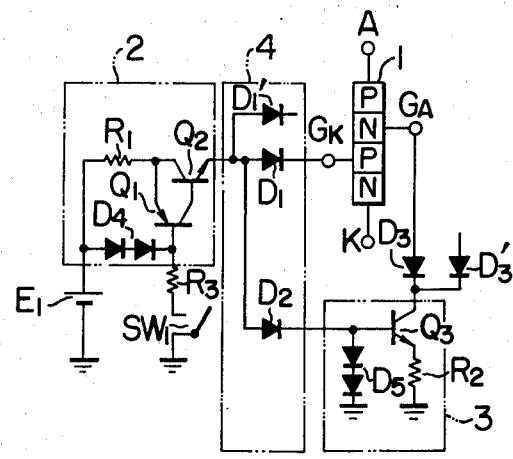
FIG. 1 is a circuit diagram of a semiconductor switch circuit employing a 4-terminal PNPN switch, which has been previously proposed by the inventors in Japanese Laid-Open Publication No. 10012/77.
Figure 2:
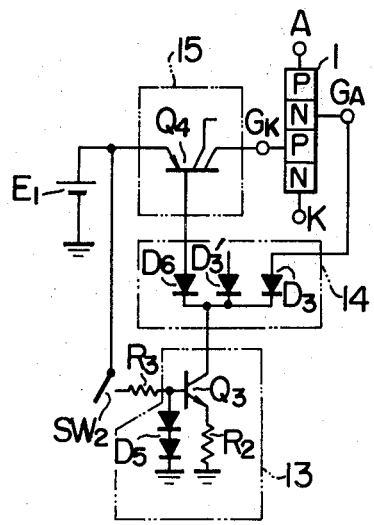
FIG. 2 is a circuit diagram of a first embodiment of the semiconductor switch circuit according to the present invention.

Referring to FIG. 2 showing a first embodiment of the semiconductor switch circuit according to the present invention, it comprises a current-sinking constant-current circuit 13 including essentially a resistor $R_2$, level shift diodes $D_5$ and an NPN transistor $Q_3$; a current change-over circuit 14 including reverse-current blocking diodes $D_3$, $D_3'$ and $D_6$; a current supplying circuit 15 in the form of a PNP transistor $Q_4$ having two collectors; and a 4-terminal PNPN switch 1 having an anode gate $G_A$ and a cathode gate $G_K$. The semiconductor switch circuit comprises further a control circuit including a power supply $E_1$, a switch $SW_2$ and a resistor $R_3$. This control circuit is simply shown as including the switch $SW_2$ and resistor $R_3$ for facilitating understanding of the circuit operation as in FIG. 1. It is apparent however that the control circuit is actually an electronic circuit. The power supply $E_1$ provided a power supply voltage of, for example, 5 volts to suit the desired integration of this control circuit.

In operation, the switch $SW_2$ is closed to supply current from the power supply $E_1$ to the base of transistor $Q_3$ and to the diodes $D_5$ in the current-sinking constant-current circuit 13 through the resistor $R_3$ to energize the current-sinking constant-current circuit 13 for turning on the PNPN switch 1. Since the potential at the base of transistor $Q_3$ is maintained substantially constant by the diodes $D_5$, a constant-current appears at the emitter of transistor $Q_3$. Further, the collector of transistor $Q_3$ acts to sink the constant current. Thus, this circuit 13 acts as a constant-current circuit.

When both the anode A and the cathode K of PNPN switch 1 have a high positive potential, current flows into the collector of transistor $Q_3$ in the current-sinking constant-current circuit 13 from the anode A of PNPN switch 1 through the anode gate $G_A$ and through the diode $D_3$ in the current change-over circuit 14 to drive the anode gate $G_A$ thereby turning on the PNPN switch 1. At this time, the diode $D_6$ in the current change-over circuit 14 is in the reverse blocking state, and the current supplying circuit 15 is not energized due to the fact that the potential at the collector of transistor $Q_3$ rises up to a level nearly equal to the potential at the anode A of PNPN switch 1.

When on the other hand, both the anode A and the cathode K of PNPN switch 1 have a negative potential, the diode $D_3$ in the current change-over circuit 14 is now in the reverse blocking state, and constant-current flows into the collector of transistor $Q_3$ in the current-sinking constant-current circuit 13 from the power supply $E_1$ through the transistor $Q_4$ providing the current supplying circuit 15 and through the diode $D_6$ in the current change-over circuit 14 to drive the base of transistor $Q_4$. As a result, constant-current flows into the cathode gate $G_K$ of PNPN switch 1 from one of the collectors of transistor $Q_4$ providing the current supplying circuit 15 to drive the cathode gate $G_K$ of PNPN switch 1 thereby turning on the PNPN switch 1. Although not shown in FIG. 2, the diode $D_3'$ and the other collector of transistor $Q_4$ may be arranged to be connected to the anode gate and cathode gate respectively of another PNPN switch, but they may not be provided if unnecessary.

It will thus be seen that the current-sinking constant-current circuit 13 acts as a sink of constant-current throughout the period in which the switch $SW_2$ is closed, and the current change-over circuit 14 acts to change-over the current path depending on the potential at the anode and cathode of PNPN switch 1, while the current supplying circuit 15 is energized principally during the period in which the anode and cathode of PNPN switch 1 have a negative potential. Therefore, the gate current flows to the PNPN switch 1 without opposing the potential at the PNPN switch 1, and the drive source $E_1$ for this semiconductor switch circuit need not have a high voltage.

In the integration of the semiconductor switch circuit into an integrated circuit form, the NPN transistor is generally the basic component rather than the PNP transistor, and the current amplification factor of the PNP transistor is small. Especially when used with a high voltage, the current amplification factor of the PNP transistor is less than unity. The anode gate sensitivity of the PNPN switch is lower than the cathode gate sensitivity. Therefore, when the current value of the current-sinking constant-current circuit 13 in the circuit configuration shown in FIG. 2 is selected to meet the anode gate sensitivity of the PNPN switch 1, a current value smaller than the above current value may well be supplied to the cathode gate $G_K$ as the cathode gate sensitivity is better than the anode gate sensitivity. Thus, the PNP transistor $Q_4$ may substantially be one having a small current amplification factor. Further, a plurality of collectors can easily be provided on such a PNP transistor. The circuit configuration shown in FIG. 2 is accordingly very advantageous in that the number of circuit elements is less than that in FIG. 1 and the circuit can be more easily integrated into the desired integrated circuit form.

Figure 3:
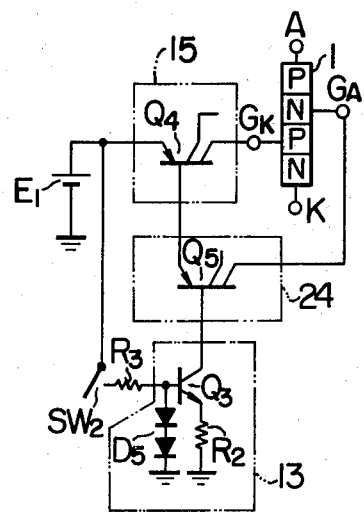
FIG. 3 is a circuit diagram of a second embodiment of the present invention.

FIG. 3 is a circuit diagram of a second embodiment of the semiconductor switch circuit according to the present invention. This second embodiment is actually a modification of the first embodiment shown in FIG. 2 in that it differs only in the structure of the current change-over circuit from the first embodiment. In the switch circuit shown in FIG. 3, a PNP transistor $Q_5$ having two collectors is used to provide a current change-over circuit 24. In other words, the diodes $D_3$, $D_3'$ and $D_6$ in FIG. 2 are not electrically isolated from one another but are formed in the same single-crystalline semiconductor region to provide an electrically equivalent transistor $Q_5$. Any current amplifying function need not be expected for this PNP transistor $Q_5$ for the reason described presently. When the anode A of PNPN switch 1 in FIG. 3 is at a high positive potential, current flows into the current-sinking constant-current circuit 13 from the anode gate $G_A$ of PNPN switch 1 through the collector and base of transistor $Q_5$. At this time, the transistor $Q_5$ functions in the way in which the illustrated relation between the collector and the emitter is exactly reversed. That is, the transistor $Q_5$ acts substantially as a simple diode as it cannot supply current to the base of transistor $Q_4$ providing the current supplying circuit 15. When, on the other hand, the PNPN switch 1 is turned on through its cathode gate $G_K$, the transistor $Q_5$ controls the transistor $Q_4$ in the current supplying circuit 15 through the emitter of the illustrated state. In this case, constant-current appears also at the collector of transistor $Q_5$ to provide back flow of current to the anode gate $G_A$ of PNPN switch 1. However, it is possible to prevent any substantial adverse effect by this current value by designing the circuit pattern in such a manner as to minimize the current amplification factor of the transistor $Q_5$. Although the embodiment shown in FIG. 3 is similar in circuit configuration and operation to the embodiment shown in FIG. 2, the former can be more easily integrated into the desired integrated circuit form than the latter since the diodes subjected to a high peak reverse voltage are utterly unnecessary.

Figure 4:
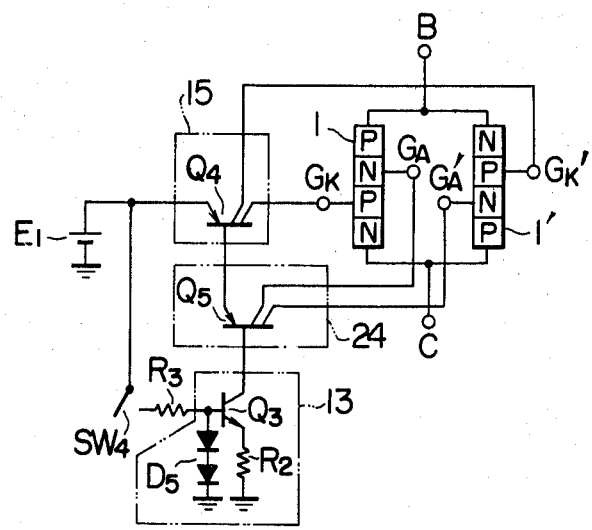
FIG. 4 is a circuit diagram of a third embodiment of the present invention.

FIG. 4 shows an application of the embodiment shown in FIG. 3 so that the switch circuit permits current flow in both the forward and reverse directions. In FIG. 4, two PNPN switches 1 and 1' have their anodes and cathodes connected in inverse-parallel relation to constitute a bilateral switch. The anode gates $G_A$ and $G_A'$ of PNPN switches 1 and 1' constituting the bilateral switch are connected to the individual collectors respectively of transistor $Q_5$ providing the current change-over circuit 24, and the cathode gates $G_K$ and $G_K'$ of PNPN switches 1 and 1' are connected to the individual collectors respectively of transistor $Q_4$ providing the current supplying circuit 15, so that an AC current can flow between the terminals B and C. The operation of the switch circuit shown in FIG. 4 will be easily understood from the description given with reference to FIG. 3. It will also be readily understood that the embodiment shown in FIG. 2 may be applied to an arrangement as shown in FIG. 4 so as to be capable of permitting current flow in both the forward and reverse directions.

Figure 5:
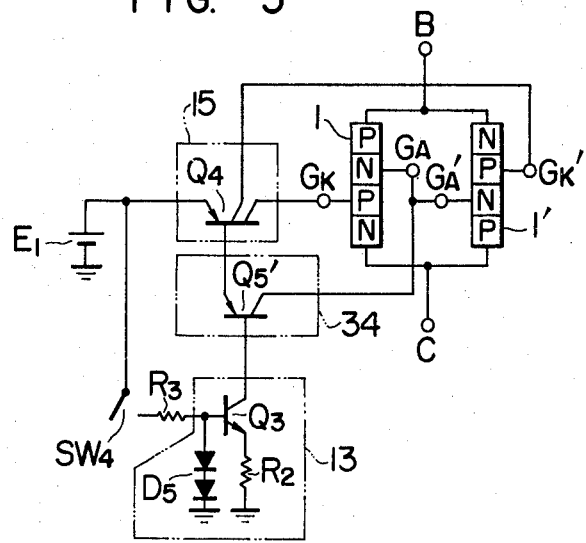
FIG. 5 is a circuit diagram of a fourth embodiment of the present invention.

FIG. 5 is a circuit diagram of another embodiment of the semiconductor switch circuit according to the present invention. The circuit configuration shown in FIG. 5 is generally similar to that shown in FIG. 4 except that the anode gates $G_A$ and $G_A'$ of PNPN switches 1 and 1' constituting the bilateral switch are shorted to be connected in common to the single collector of a transistor $Q_5'$ providing a current change-over circuit 34. The construction shown in FIG. 5 can be obtained when the two PNPN switches 1 and 1' are formed in the same single-crystalline semiconductor region so that they are common-connected substantially at the portions corresponding to their anode gates. Thus, when integrated into an integrated circuit form, the construction shown in FIG. 5 is effective in further improving the integration density.

It will be understood from the foregoing detailed description that the present invention provides a semiconductor switch circuit employing at least one PNPN switch for switching an AC signal, in which the PNPN switch inserted in a load circuit operating with a positive or negative voltage can be reliably turned on by a single power supply of low voltage. The drive circuit drives the PNPN switch with a constant current without consuming wasteful power and producing any noise and has a simple circuit construction. The semiconductor switch circuit according to the present invention can be economically advantageously integrated into the desired integrated circuit form. Further, the current supplying circuit itself may be modified to be of the constant-current type although this modification results in a slightly complicated construction.

We claim:

1. A semiconductor switch circuit comprising:
   a bilateral switch including a pair of 4-terminal PNPN switches connected in inverse parallel, each having a cathode gate and an anode gate;
   a current supplying circuit for supplying a current to the cathode gates of said bilateral switch;
   a current sinking circuit of constant current type; and
   a current change-over circuit including current path change-over means for selectively switching a current flowing out from the anode gates of said bilateral switch and a current driving said current supplying circuit, respectively, to said current sinking circuit depending on a potential of said PNPN switches constituting said bilateral switch,
   wherein said current supplying circuit includes a PNP transistor having two collectors which are respectively connected to the cathode gates of said PNPN switches constituting said bilateral switch.

2. A semiconductor switch circuit comprising:
   a bilateral switch includig a couple of 4-terminal PNPN switches connected in inverse parallel, each having a cathode gate and an anode gate;
   a current supplying circuit for supplying a current to the cathode gates of said bilateral switch;
   a current sinking circuit of constant current type; and
   a current change-over circuit including current path change-over means for selectively switching a current flowing out from the anode gates of said bilateral switch and a current driving said current supplying circuit, respectively, to said current sinking circuit depending on a potential of said PNPN switches constituting said bilateral switch,
   wherein said change-over circuit includes a PNP transistor having two collectors which are respectively connected to the anode gates of said PNPN switches constituting said bilateral switch.

3. A semiconductor switch circuit comprising:
   a bilateral switch including a pair of 4-terminal PNPN switches, each having a cathode, a cathode gate, an anode and an anode gate, said 4-terminal PNPN switches being connected together in such an inverse parallel relation that the anode and cathode of one PNPN switch are connected to the cathode and anode of the other PNPN switch, respectively, so as to pass through the bilateral switch a continuous A.C. signal applied across the cathode and anode of each of the PNPN switches;
   a PNP transistor having two collectors connected respectively to the cathode gates of the bilateral switch for feeding a cathode gate driving current to the respective cathode gates;
   a current sinking circuit for taking in a constant current when rendered operative; and
   current path change-over means for connecting said current sinking circuit to a selected one of the anode gates of said PNPN switches and to a base of said PNP transistor in response to a potential of one of the cathode and the anode of said one of said PNPN switches.

4. A semiconductor switch circuit according to claim 3, wherein said current path change-over means comprises a pair of diodes each having an anode and a cathode, the anode of one of said pair of diodes being connected to the anode gate of one of the PNPN switches, the anode of the other diode of said pair of diodes being connected to the anode gate of the other PNPN switch, and the cathodes of said pair of diodes being connected to said current sinking circuit, and another diode having an anode and a cathode connected at an anode thereof to the base of said PNP transistor and at the cathode thereof to said current sinking circuit, wherein the cathodes of said pair of diodes and said another diode have the same polarity.

* * * * *